US011326049B2

(12) United States Patent
Chen

(10) Patent No.: US 11,326,049 B2
(45) Date of Patent: May 10, 2022

(54) COMPOSITION FOR SURFACE TREATMENT

(71) Applicant: FUJIMI INCORPORATED, Kiyosu (JP)

(72) Inventor: Jingzhi Chen, Tonglou Township (TW)

(73) Assignee: FUJIMI INCORPORATED ( * ) Notice: Subject to any disclaimer, the term of this patent is extended or adjusted under 35 U.S.C. 154(b) by 98 days.

(21) Appl. No.: 16/330,034

(22) PCT Filed: Aug. 9, 2017

(86) PCT No.: PCT/JP2017/029003
§ 371 (c)(1),
(2) Date: Mar. 1, 2019

(87) PCT Pub. No.: WO2018/055941
PCT Pub. Date: Mar. 29, 2018

(65) Prior Publication Data
US 2019/0203027 A1 Jul. 4, 2019

(30) Foreign Application Priority Data
Sep. 21, 2016 (JP) .............................. JP2016-184768

(51) Int. Cl.
C11D 3/37 (2006.01)
C11D 7/26 (2006.01)
C11D 7/32 (2006.01)
C08L 29/04 (2006.01)
H01L 21/02 (2006.01)
C08G 61/04 (2006.01)
C08L 33/02 (2006.01)
C08L 33/24 (2006.01)
C11D 11/00 (2006.01)
C11D 7/22 (2006.01)
H01L 21/304 (2006.01)
C11D 3/30 (2006.01)
C11D 7/34 (2006.01)

(52) U.S. Cl.
CPC ............. C08L 29/04 (2013.01); C08G 61/04 (2013.01); C08L 33/02 (2013.01); C08L 33/24 (2013.01); C11D 3/30 (2013.01); C11D 7/22 (2013.01); C11D 7/26 (2013.01); C11D 7/261 (2013.01); C11D 7/34 (2013.01); C11D 11/0047 (2013.01); H01L 21/02065 (2013.01); H01L 21/304 (2013.01); C08G 2261/1452 (2013.01); H01L 21/02002 (2013.01)

(58) Field of Classification Search
CPC .................................. C11D 7/261; C11D 7/34
USPC ................ 510/175, 176, 477, 495, 505, 506
See application file for complete search history.

(56) References Cited

U.S. PATENT DOCUMENTS

| 6,743,859 | B2 * | 6/2004 | Kowaka .................... D01F 6/14 525/62 |
| 7,851,426 | B2 * | 12/2010 | Nishiwaki ......... H01L 21/02074 510/175 |
| 8,614,653 | B1 * | 12/2013 | Salgado .................... G09G 5/34 345/56 |
| 8,765,653 | B2 * | 7/2014 | Tamboli .............. C11D 11/0047 510/175 |
| 8,916,338 | B2 * | 12/2014 | Quillen ............. H01L 21/31133 430/329 |
| 10,319,605 | B2 * | 6/2019 | Kamei ..................... C09G 1/06 |
| 2003/0171233 | A1 | 9/2003 | Abe et al. |
| 2003/0196386 | A1 * | 10/2003 | Hattori ................. C09K 3/1409 51/307 |
| 2005/0282718 | A1 | 12/2005 | Nakagawa |
| 2008/0173328 | A1 * | 7/2008 | Nishiwaki ............ C11D 3/2082 134/6 |
| 2010/0086813 | A1 * | 4/2010 | Yamamoto ............. B01J 8/0492 429/434 |

(Continued)

FOREIGN PATENT DOCUMENTS

| JP | 2001-064679 A | 3/2001 |
| JP | 2005-303060 A | 10/2005 |

(Continued)

OTHER PUBLICATIONS

English language machine translation of WO2010136387. (Year: 2010).*

(Continued)

Primary Examiner — Gregory R Delcotto
(74) Attorney, Agent, or Firm — Katten Muchin Rosenman LLP

(57) ABSTRACT

To provide a composition for surface treatment capable of treating a surface of a polished object to be polished having both of a silicon-silicon bond and a nitrogen-silicon bond by sufficiently removing defects on the surface of the polished object to be polished. The composition for surface treatment contains a nonionic water-soluble polymer (A) having a main chain including only a carbon atom or a main chain consisting of a carbon atom and a nitrogen atom, and an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom, and the composition is used for surface treatment of a polished object to be polished containing a silicon-silicon bond and a nitrogen-silicon bond and a pH of the composition is less than 9.0.

10 Claims, No Drawings

(56) References Cited

U.S. PATENT DOCUMENTS

| | | | | |
|---|---|---|---|---|
| 2013/0123411 A1* | 5/2013 | Quillen | .................. | G03F 7/426 |
| | | | | 524/377 |
| 2013/0225464 A1* | 8/2013 | Harada | .............. | C11D 11/0047 |
| | | | | 510/175 |
| 2014/0242741 A1* | 8/2014 | Orita | ................ | H01L 21/02118 |
| | | | | 438/57 |

FOREIGN PATENT DOCUMENTS

| | | | | | |
|---|---|---|---|---|---|
| JP | 2006-005246 | A | | 1/2006 | |
| JP | 2009-147389 | A | | 7/2009 | |
| JP | 2012-94852 | A | | 5/2012 | |
| JP | 2012-227291 | A | | 11/2012 | |
| TW | 200821381 | A | | 5/2008 | |
| TW | 201219562 | A | | 5/2012 | |
| WO | WO-2010136387 | A1 * | 12/2010 | ............. | H01L 31/18 |

OTHER PUBLICATIONS

International Search Report for International Application No. PCT/JP2017/029003 dated Nov. 21, 2017.
Office Action for TW Application No. 106128239 dated Feb. 8, 2021.

\* cited by examiner

COMPOSITION FOR SURFACE TREATMENT

TECHNICAL FIELD

The present invention relates to a composition for surface treatment.

BACKGROUND ART

In recent years, with the multi-layered wiring on a surface of a semiconductor substrate, when a device is produced, a so-called Chemical Mechanical Polishing (CMP) technique for physically polishing and planarizing a semiconductor substrate is used. CMP is a method for planarizing a surface of an object to be polished (polished object) of a semiconductor substrate or the like by using a polishing composition (slurry) containing abrasive grains of silica, alumina, ceria or the like, an anticorrosive, a surfactant, and the like, and the object to be polished (polished object) is a wiring, a plug, or the like, which is made of silicon, polysilicon, silicon oxide, silicon nitride, a metal, or the like.

On a surface of a semiconductor substrate after a CMP step, impurities (defects) remain. In the impurities, for example, abrasive grains or a metal, being derived from a polishing composition that has been used in CMP; an organic matter of an anticorrosive, a surfactant or the like; a silicon-containing material being an object to be polished; a silicon-containing material or a metal, being generated by polishing a metal wiring, a plug or the like; and further an organic matter of pad scraps or the like being generated from various kinds of pads or the like, are included.

When a surface of a semiconductor substrate is contaminated with these impurities, the electric characteristics of the semiconductor are adversely affected, and the reliability of a device may be lowered. Therefore, it is desirable to remove these impurities from the surface of the object to be polished that has been polished (polished object to be polished) after a CMP step.

As a cleaning composition for removing these impurities, for example, those disclosed in Patent Literatures 1 to 4 are known.

CITATION LIST

Patent Literatures

Patent Literature 1: JP 2009-147389 A
Patent Literature 2: JP 2001-064679 A
Patent Literature 3: JP 2006-005246 A
Patent Literature 4: JP 2005-303060 A

SUMMARY OF INVENTION

Technical Problem

However, in a conventional technique, there has been a problem that defects remaining on a polished object to be polished having a silicon-silicon bond and a nitrogen-silicon bond cannot be sufficiently removed.

Accordingly, a problem to be solved by the present invention is to provide a composition for surface treatment capable of treating a surface of a polished object to be polished by sufficiently removing defects on the surface of the polished object to be polished having both of a silicon-silicon bond and a nitrogen-silicon bond.

Solution to Problem

In view of the above-described problem, the present inventors made intensive studies. As a result, the present inventors have found that the above-described problem can be solved by providing a composition for surface treatment, containing a nonionic water-soluble polymer (A) having a main chain including only a carbon atom or a main chain consisting of a carbon atom and a nitrogen atom (also referred to as a nonionic water-soluble polymer (A)); and an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom (also referred to as an anionic water-soluble polymer (B)), in which the composition is used for surface treatment of a polished object to be polished containing a silicon-silicon bond and a nitrogen-silicon bond and a pH of the composition is less than 9.0; and thus have completed the present invention.

Advantageous Effects of Invention

According to the present invention, a composition for surface treatment capable of treating a surface of a polished object to be polished by sufficiently removing defects on the surface of the polished object to be polished having both of a silicon-silicon bond and a nitrogen-silicon bond can be provided.

DESCRIPTION OF EMBODIMENTS

The present invention is a composition for surface treatment, containing a nonionic water-soluble polymer (A) having a main chain including only a carbon atom or a main chain consisting of a carbon atom and a nitrogen atom; and an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom, in which the composition is used for surface treatment of a polished object to be polished containing a silicon-silicon bond and a nitrogen-silicon bond and a pH of the composition is less than 9.0.

According to the constitution, a surface of a polished object to be polished can be treated by sufficiently removing defects on the surface of the polished object to be polished having both of a silicon-silicon bond and a nitrogen-silicon bond.

In this regard, the composition according to the present invention removes impurities (defects) remaining on a polished object to be polished (substrate), and from this point of view, it can be said that the surface state of the surface of the polished object to be polished (substrate) is changed (treated). Therefore, the composition is referred to as a "composition for surface treatment".

(CMP Step)

As described above, the composition for surface treatment according to the present invention is used after a CMP step.

In this regard, the CMP step may be a polishing step consisting of a single step, or may be a polishing step including multiple steps. As the polishing step including multiple steps, for example, there is a step of performing a finish polishing step after a preliminary polishing step (rough polishing step), or a step of performing a secondary polishing step once or more after a primary polishing step, and then performing a finish polishing step. Further, as the polishing composition to be used in a CMP step, a known polishing composition that is used for adequately polishing an object to be polished having both of a silicon-silicon bond and a nitrogen-silicon bond can be appropriately used, and for example, one containing abrasive grains of colloidal silica or the like, a water-soluble polymer such as polyvinylpyrrolidone (PVP), or the like can be preferably used. In addition, as the polishing device, a common polishing device can be used, and either a one-side polishing device or a double-side polishing device may be used. Further, as for the polishing pad, polyurethane or the like is suitable.

As described above, a polished object to be polished is prepared by performing a CMP step on an object to be polished.

(Polished Object to be Polished)

An "object to be polished" to be subjected to a CMP step contains both a silicon-silicon bond and a nitrogen-silicon bond. Accordingly, a "polished object to be polished" on which a CMP step has been performed is also contains a silicon-silicon bond and a nitrogen-silicon bond. Further, an "object to be subjected to surface treatment" that is subjected to surface treatment by removing residual impurities is also contains a silicon-silicon bond and a nitrogen-silicon bond.

In this regard, examples of the object to be polished (polished object to be polished) having a silicon-silicon bond include polysilicon, amorphous silicon, single-crystalline silicon, n-type doped single-crystalline silicon, p-type doped single-crystalline silicon, and a Si-based alloy such as SiGe. Examples of the object to be polished (polished object to be polished) having a silicon-nitrogen bond include a silicon nitride film, and SiCN (silicon carbonitride).

Supplementarily, the expression "polished object to be polished containing both of a silicon-silicon bond and a nitrogen-silicon bond" is referred to as a polished object to be polished, and means that one region contains a "silicon-silicon bond" and another region contains a "nitrogen-silicon bond" in the polished object to be polished.

According to the composition for surface treatment of the present invention, defects on a surface of a polished object to be polished containing both of a silicon-silicon bond and a nitrogen-silicon bond can be sufficiently removed, which has not been conventionally achieved.

(Composition for Surface Treatment)

(Nonionic Water-Soluble Polymer (A))

The composition for surface treatment according to the present invention contains a nonionic water-soluble polymer (A) that has a main chain including only a carbon atom or a main chain consisting of a carbon atom and a nitrogen atom. Herein, the expression "main chain" means a main chain of a chain compound constituting a polymer. The main chain of the nonionic water-soluble polymer (A) of the present invention includes only a carbon atom or a main chain consisting of a carbon atom and a nitrogen atom. According to such an embodiment, the expected effects of the present invention can be efficiently exerted.

In addition, in a preferred embodiment of the present invention, the nonionic water-soluble polymer (A) contains a constituent unit represented by the following formula (1):

[Chemical formula 1]

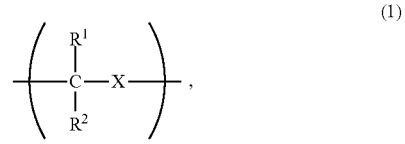

in which X is represented by the following formula:

[Chemical formula 2]

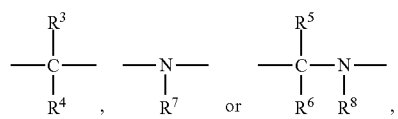

$R^1$ to $R^6$ are each independently a hydrogen atom or -J, -J is represented by a hydroxyl group,

[Chemical formula 3]

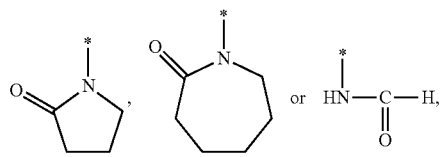

$R^7$ and $R^8$ are each independently a hydrogen atom or -E, -E is represented by the following formula:

[Chemical formula 4]

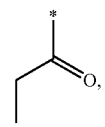

and the constituent unit contains at least one of -J and -E.

It is presumed that the mechanism by which such a composition for surface treatment exerts the expected effects of the present invention is as follows. Of course, the scope of protection of the present invention is not limited by such a mechanism. That is, a polished object to be polished having both of a silicon-silicon bond and a nitrogen-silicon bond generally has a hydrogen atom on a surface of the polished object to be polished, and therefore, has a high contact angle of water. On the other hand, by using the nonionic water-soluble polymer (A) of such an embodiment, the nonionic water-soluble polymer (A) acts as a wetting agent to lower the contact angle of water on a surface of the polished object to be polished. It is presumed that impurities are easily removed according to such an action. Note that in the present specification, the symbol * represents a bonding position.

In (1) of the present embodiment, X is represented by the following formula:

[Chemical formula 5]

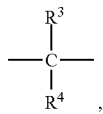

and it is preferred that at least one of $R^1$ to $R^4$ is -J, and -J is a hydroxyl group.

Further, in (2) of the present embodiment, X is represented by the following formula:

[Chemical formula 6]

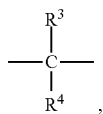

and it is preferred that at least one of $R^1$ to $R^4$ is -J, and -J is represented by the following formula:

[Chemical formula 7]

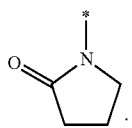

In addition, in (3) of the present embodiment, X is represented by the following formula:

[Chemical formula 8]

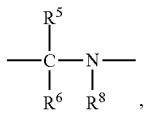

and it is preferred that at least one of $R^1$, $R^2$, $R^5$ and $R^6$ is a hydrogen atom, $R^8$ is -E, and -E is represented by the following formula:

[Chemical formula 9]

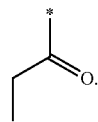

Among them, from the viewpoint of exerting the expected effects of the present invention, (1) of the present embodiment and (2) of the present embodiment are preferred, and (1) of the present embodiment is more preferred.

In a preferred embodiment of the present invention, the nonionic water-soluble polymer (A) is at least one kind selected from the group consisting of polyvinyl alcohol (PVA), a copolymer containing a constituent unit derived from polyvinyl alcohol (PVA) as a part of a structure, polyvinylpyrrolidone (PVP), a copolymer containing a constituent unit derived from polyvinylpyrrolidone (PVP) as a part of a structure, polyvinyl caprolactam, a copolymer containing a constituent unit derived from polyvinyl caprolactam as a part of a structure, polyN-vinylformamide, and a copolymer containing a constituent unit derived from polyN-vinylformamide as a part of a structure. According to such an embodiment, the expected effects of the present invention can be efficiently exerted.

In this regard, in a case where the nonionic water-soluble polymer (A) is a copolymer, the form may be any one of a block copolymer, a random copolymer, a graft copolymer, and an alternating copolymer.

In a preferred embodiment of the present invention, the nonionic water-soluble polymer (A) is preferably polyvinyl alcohol (PVA) or a copolymer containing a constituent unit derived from polyvinyl alcohol (PVA) as a part of a structure, or polyvinylpyrrolidone (PVP) or a copolymer containing a constituent unit derived from polyvinylpyrrolidone (PVP) as a part of a structure, and the nonionic water-soluble polymer (A) is more preferably polyvinyl alcohol (PVA) or a copolymer containing a constituent unit derived from polyvinyl alcohol (PVA) as a part of a structure. According to such an embodiment, the expected effects of the present invention can be efficiently exerted.

In addition, in a preferred embodiment of the present invention, the polyvinyl alcohol (PVA) or the copolymer containing a constituent unit derived from polyvinyl alcohol (PVA) as a part of a structure has a saponification degree of 60% or more. According to such an embodiment, the expected effects of the present invention can be efficiently exerted. Further, in a preferred embodiment of the present invention, the saponification degree is preferably 80% or more, and more preferably 90% or more.

In the present invention, from the viewpoint of sufficiently removing the defects, the weight average molecular weight of the nonionic water-soluble polymer (A) is preferably 800 or more, more preferably 2,000 or more, furthermore preferably 4,000 or more, still more preferably 6,000 or more, and still furthermore preferably 8,000 or more. Further, from the viewpoint of sufficiently removing the defects, the weight average molecular weight of the nonionic water-soluble polymer (A) is preferably 80,000 or less, more preferably 60,000 or less, furthermore preferably 45,000 or less, still more preferably 30,000 or less, and still furthermore preferably 20,000 or less. In this regard, the weight average molecular weight is measured by gel permeation chromatography (GPC) using a polystyrene of which the molecular weight is known as the reference substance.

From the viewpoint of sufficiently removing the defects, the content of the nonionic water-soluble polymer (A) is preferably 0.01% by mass or more, more preferably 0.05% by mass or more, and furthermore preferably 0.08% by mass or more, relative to the total mass of the composition for surface treatment. Further, the content of the nonionic water-soluble polymer (A) is preferably 5% by mass or less, more preferably 1% by mass or less, furthermore preferably 0.6% by mass or less, still more preferably 0.3% by mass or less, and still furthermore preferably 0.2% by mass or less.

(Anionic Water-Soluble Polymer (B))

The composition for surface treatment according to the present invention contains an anionic water-soluble polymer (B), the anionic water-soluble polymer (B) contains a main chain including only a carbon atom, and a side chain, and the side chain is bonded to the main chain including only a carbon atom and further has a sulfonic acid group or a group having a salt thereof or a carboxyl group or a group having a salt thereof. It is presumed that the mechanism by which such a composition for surface treatment exerts the expected effects of the present invention is as follows. Of course, the scope of protection of the present invention is not limited by such a mechanism. That is, it is presumed that the anionic water-soluble polymer (B) functions as a dispersant, and removes impurities remaining on a polished object to be polished. Note that the expression "side chain" is referred to as a chain branching from a "main chain".

As the salt (in particular, counter cation), it is not particularly limited, and an ammonium salt, a sodium salt or the like can be mentioned.

A sulfonic acid group or a group having a salt thereof, or a carboxyl group or a group having a salt thereof may be directly bonded to the main chain including only a carbon atom as a side chain, or may be bonded to the main chain including only a carbon atom via another bonding group. Examples of the bonding group include an arylene group having 6 to 24 carbon atoms, and a divalent acid amide. In this regard, as the arylene group having 6 to 24 carbon atoms, a phenylene group, a naphthalenediyl group or the like is suitable.

In a preferred embodiment of the present invention, the anionic water-soluble polymer (B) contains a constituent unit represented by the following formula (2):

[Chemical formula 10]

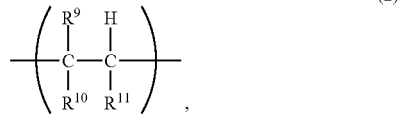

(2)

in which $R^9$ is a hydrogen atom or a methyl group, $R^{10}$ and $R^{11}$ are each independently a hydrogen atom, $-COOR^{12}$, or -G, provided that $R^{10}$ and $R^{11}$ are not hydrogen atoms at the same time, -G is represented by the following formula:

[Chemical formula 11]

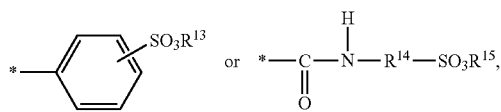

$R^{12}$, $R^{13}$ and $R^{15}$ are each independently a hydrogen atom, an alkyl group having 1 to 12 carbon atoms, a hydroxyalkyl group having 1 to 12 carbon atoms, or a counter cation, and $R^{14}$ is a divalent group. According to such an embodiment, the expected effects of the present invention can be efficiently exerted.

In this regard, as the alkyl group having 1 to 12 carbon atoms, it may be a straight chain or a branched chain, and examples of the alkyl group having 1 to 12 carbon atoms include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a hexadecyl group, a stearyl group, an icosyl group, a docosyl group, a tetracosyl group, a triacontyl group, an isopropyl group, an isobutyl group, a tertiary butyl group, an isopentyl group, a neopentyl group, a tertiary pentyl group, an isoheptyl group, a 2-ethylhexyl group, and an isodecyl group.

Further, as the hydroxyalkyl group having 1 to 12 carbon atoms, a group in which at least one hydrogen atom of the alkyl group having 1 to 12 carbon atoms is replaced with a hydroxyl group can be mentioned.

In addition, as the divalent group, an alkylene group having 1 to 12 carbon atoms, an arylene group having 6 to 24 carbon atoms, or the like can be mentioned. The alkylene group having 1 to 12 carbon atoms is a divalent substituent obtained by removing one hydrogen from the above-described alkyl group having 1 to 12 carbon atoms. Further, as the arylene group having 6 to 24 carbon atoms, a phenylene group, a naphthalenediyl group or the like is suitable.

In addition, as the counter cation, an ammonium ion, a sodium ion or the like can be mentioned.

In (1) of the present embodiment, $R^9$ is a hydrogen atom or a methyl group, $R^{10}$ and $R^{11}$ are each $-COOR^{12}$ or a hydrogen atom, and $R^{12}$ is a hydrogen atom or a counter cation. In this case, in particular, the pH is preferably less than 7.0, and more preferably less than 5.0.

Further, in (2) of the present embodiment, the anionic water-soluble polymer (B) includes a constituent unit in which $R^9$ is a hydrogen atom or a methyl group, $R^{10}$ and $R^{11}$ are each $-COOR^{12}$ or a hydrogen atom, and $R^{12}$ is a hydrogen atom or a counter cation; and a constituent unit in which $R^9$ is a hydrogen atom or a methyl group, $R^{10}$ and $R^{11}$ are both $-COOR^{12}$, and $R^{12}$ is a hydrogen atom or a counter cation. In this case, the anionic water-soluble polymer (B) may be in a form of an anhydride.

In addition, in (3) of the present embodiment, $R^9$ is a hydrogen atom or a methyl group, $R^{10}$ and $R^{11}$ are both $-COOR^{12}$, and $R^{12}$ is a hydrogen atom or a counter cation.

Further, in (4) of the present embodiment, the anionic water-soluble polymer (B) includes a constituent unit in which $R^9$ is a hydrogen atom or a methyl group, $R^{10}$ and $R^{11}$ are each $-COOR^{12}$ or a hydrogen atom, and $R^{12}$ is a hydrogen atom or a counter cation; and a constituent unit in which $R^9$ is a hydrogen atom or a methyl group, at least one of $R^{10}$ and $R^{11}$ is $-COOR^{12}$, and $R^{12}$ is a hydroxyalkyl group having 1 to 12 carbon atoms.

In addition, in (5) of the present embodiment, the anionic water-soluble polymer (B) includes a constituent unit in which $R^9$ is a hydrogen atom or a methyl group, at least one of $R^{10}$ and $R^{11}$ is $-COOR^{12}$, and $R^{12}$ is a hydrogen atom or a counter cation, and $R^9$ is a hydrogen atom or a methyl group, at least one of $R^{10}$ and $R^{11}$ is -G, -G is represented by the following formula:

[Chemical formula 12]

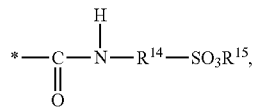

in which $R^{14}$ is a divalent group, and $R^{15}$ is a hydrogen atom, an alkyl group having 1 to 12 carbon atoms, a hydroxyalkyl group having 1 to 12 carbon atoms, or a counter cation.

Further, in (6) of the present embodiment, $R^9$ is a hydrogen atom or a methyl group, at least one of $R^{10}$ and $R^{11}$ is -G, and -G is represented by the following formula:

[Chemical formula 13]

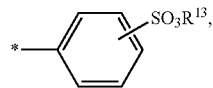

in which $R^{13}$ is a hydrogen atom, an alkyl group having 1 to 12 carbon atoms, a hydroxyalkyl group having 1 to 12 carbon atoms, or a counter cation.

In addition, in (7) of the present embodiment, $R^9$ is a hydrogen atom or a methyl group, at least one of $R^{10}$ and $R^{11}$ is -G, and -G is represented by the following formula:

[Chemical formula 14]

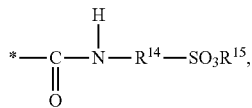

in which $R^{14}$ is a divalent group, and $R^{15}$ is a hydrogen atom, an alkyl group having 1 to 12 carbon atoms, a hydroxyalkyl group having 1 to 12 carbon atoms, or a counter cation.

Among them, from the viewpoint of exerting the expected effects of the present invention, (1) or (2) of the present embodiment is preferred, and (1) of the present embodiment is more preferred. In this case, as described above, in particular, the pH is preferably less than 7.0, and more preferably less than 5.0.

Further, in a preferred embodiment of the present invention, at least one of $R^{10}$ and $R^{11}$ in the anionic water-soluble polymer (B) is -G, -G is represented by the following formula:

[Chemical formula 15]

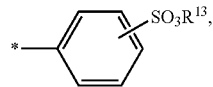

in which $R^{13}$ is the same as in the above, and the anionic water-soluble polymer (B) has a weight average molecular weight of 100,000 or more. According to such an embodiment, the expected effects of the present invention can be efficiently exerted.

In the present invention, from the viewpoint of sufficiently removing the defects, the weight average molecular weight of the anionic water-soluble polymer (B) is preferably 400 or more, more preferably 1,000 or more, furthermore preferably 2,000 or more, and still furthermore preferably 2,500 or more. Further, the weight average molecular weight of the anionic water-soluble polymer (B) may also be 8,000 or more, may also be 10,000 or more, may also be 30,000 or more, may also be 50,000 or more, may also be 80,000 or more, or may also be 100,000 or more. In addition, from the viewpoint of sufficiently removing the defects, the weight average molecular weight of the anionic water-soluble polymer (B) is preferably 1,000,000 or less, and more preferably 900,000 or less, and may also be 300,000 or less, may also be 150,000 or less, or may also be 80,000 or less. Further, in order to more efficiently obtain the expected effects of the present invention, the weight average molecular weight of the anionic water-soluble polymer (B) is preferably 50,000 or less, more preferably 30,000 or less, furthermore preferably 10,000 or less, and particularly preferably 8,000 or less.

In this regard, the weight average molecular weight is measured by gel permeation chromatography (GPC) using a polystyrene of which the molecular weight is known as the reference substance.

From the viewpoint of sufficiently removing the defects, the content of the anionic water-soluble polymer (B) is preferably 0.01% by mass or more, and more preferably 0.05% by mass or more, relative to the total mass of the composition for surface treatment. Further, the content of the anionic water-soluble polymer (B) is preferably 5% by mass or less, more preferably 1% by mass or less, furthermore preferably 0.6% by mass or less, still more preferably 0.3% by mass or less, and still furthermore preferably 0.2% by mass or less.

(pH)

The composition for surface treatment according to the present invention has a pH of less than 9.0. When the pH is 9.0 or more, the expected effects of the present invention cannot be exerted. In this regard, as the value of pH, a value measured by the method in Examples is adopted.

The composition for surface treatment according to the present invention is not particularly limited as long as the pH is less than 9.0, and the pH is preferably less than 8.0, more preferably less than 7.0, and furthermore preferably less than 6.0, and may also be less than 4.0, or may also be less than 3.5. According to a preferred embodiment of the present invention, the pH of the composition for surface treatment is less than 7.0. Further, the pH of the composition for surface treatment according to the present invention is preferably 1.5 or more, and more preferably 2.0 or more.

In a case where the pH is adjusted, a pH adjusting agent is preferably used. As such a pH adjusting agent, a known acid or base, or a salt thereof can be used.

Specific examples of the acid that may be used as the pH adjusting agent include an inorganic acid such as hydrochloric acid, sulfuric acid, nitric acid, hydrofluoric acid, boric acid, carbonic acid, hypophosphorous acid, phosphorous acid, and phosphoric acid; and an organic acid such as formic acid, acetic acid, propionic acid, butyric acid, pentanoic acid, 2-methylbutyric acid, hexanoic acid, 3,3-dimethyl-butyric acid, 2-ethylbutyric acid, 4-methylpentanoic acid, heptanoic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid. In a case where an inorganic acid is used as the pH adjusting agent, in particular, sulfuric acid, nitric acid, phosphoric acid or the like is particularly preferred from the viewpoint of improving the polishing speed, and in a case where an organic acid is used as the pH adjusting agent, glycolic acid, succinic acid, maleic acid, citric acid, tartaric acid, malic acid, gluconic acid, itaconic acid or the like is preferred.

Examples of the base that may be used as the pH adjusting agent include an amine such as an aliphatic amine, and an aromatic amine; an ammonium solution; an organic base such as quaternary ammonium hydroxide; a hydroxide of an alkali metal, such as potassium hydroxide; a hydroxide of a Group 2 element; an amino acid such as histidine; and ammonia.

Among these pH adjusting agents, from the viewpoint of the ease of the pH adjustment and of further reducing the impurities, nitric acid, an ammonium solution, or an amino acid such as histidine is more preferred.

The pH adjusting agent may be used alone or in combination of two or more kinds thereof. The addition amount of the pH adjusting agent is not particularly limited, and may be appropriately adjusted so that the polishing composition has a desired pH.

(Dispersing Medium)

The composition for surface treatment according to one embodiment of the present invention generally contains a dispersing medium (solvent). The dispersing medium has a function of dispersing or dissolving respective components. The dispersing medium is more preferably to be only water. Further, the dispersing medium may also be a mixed solvent of water and an organic solvent in order to disperse or dissolve respective components.

From the viewpoint of inhibiting the contamination of an object to be subjected to surface treatment or the action of other components, the water is preferably a water not containing impurities as much as possible. For example, a water in which the total content of the transition metal ions is 100 ppb or less is preferred. In this regard, the purity of the water can be increased, for example, with an operation of removing impurity ions by using an ion exchange resin, of removing foreign matters by a filter, of distillation, or the like. Specifically, as the water, for example, deionized water (ion exchanged water), pure water, ultrapure water, distilled water, or the like is preferably used.

(Other Additive Agents)

The composition for surface treatment according to one embodiment of the present invention may contain other additive agents at an arbitrary ratio as needed within the range not inhibiting the effects of the present invention. However, since the additive agents cause impurities, the addition amount of the additive agents is preferably as small as possible, and more preferably the additive agents are not contained. Examples of the other additive agents include an antiseptic agent, a dissolved gas, a reducing agent, and an oxidizing agent.

Further, it is preferred that the composition for surface treatment according to the present invention does not contain polishing granules (abrasive grains).

(Method for Producing Composition for Surface Treatment)

In addition, in the present invention, there is provided a method for producing a composition for surface treatment, including mixing a nonionic water-soluble polymer (A) having a main chain including only a carbon atom or a main chain consisting of a carbon atom and a nitrogen atom, and an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom, in which a pH of the composition for surface treatment is adjusted to a pH of less than 9.0, and is used for surface treatment of a polished object to be polished containing a silicon-silicon bond and a nitrogen-silicon bond.

The above-described method for producing a composition for surface treatment is not particularly limited, and a composition for surface treatment can be obtained by stirring and mixing respective components constituting the composition for surface treatment, and other components as needed with a dispersing medium. The temperature when respective components are mixed is not particularly limited, and preferably 10 to 40° C., and may be raised to increase the rate of dissolution. Further, the mixing time is not also particularly limited.

(Method for Surface Treatment for Polished Object to be Polished)

As described above, by removing impurities from a surface of a polished object to be polished with the use of the composition for surface treatment according to the present invention, the surface state on the surface of the polished object to be polished (substrate) is changed. This method is referred to as a "method for surface treatment". Accordingly, in the present invention, a method for surface treatment for a polished object to be polished, including performing surface treatment on a polished object to be polished by using the above-described composition for surface treatment is also provided.

As the method for surface treatment, a general method can be used except for using the above-described composition for surface treatment. For example, a method in which a polished object to be polished (hereinafter, also referred to as "object to be subjected to surface treatment") is immersed in a composition for surface treatment, a method of performing ultrasonic treatment, a method in which a composition for surface treatment is continuously poured and flowed to an object to be subjected to surface treatment while rotating and treating the object to be subjected to surface treatment by using a pad, or the like can be mentioned. As the pad, a common nonwoven fabric, polyurethane, a porous fluorine resin, or the like may be used without any particular limitation.

As the surface treatment device, a common polishing device to which a holder for holding a polished object to be polished and the like, a motor capable of changing the rotation speed, and the like are attached, and which has a polishing platen on which a pad can be stuck, may be used.

In this regard, the treatment conditions in a case of a method in which a composition for surface treatment is continuously poured and flowed to a polished object to be polished while rotating and treating the polished object to be polished by using a pad are not also particularly limited, and for example, the pressure between the polished object to be polished and the pad is preferably 0.5 to 10 psi. The rotation speed of head is preferably 10 to 100 rpm. Further, the rotation speed of the polishing platen is preferably 10 to 100 rpm. The supply amount is not limited, and it is preferred that a surface of an object to be subjected to surface treatment is covered with a composition for surface treatment, and the supply amount is for example, 10 to 5000 ml/min. Further, the surface treatment time is not also particularly limited, and preferably 5 to 180 seconds.

Within such a range, impurities can be removed more favorably.

As the temperature of a composition for surface treatment at the time of surface treatment, it is not particularly limited, generally room temperature may be accepted, and heating to around 40° C. or more and 70° C. or less may be accepted within the range not impairing performance.

(Water-Washing Step)

In the present invention, a water-washing step with water may be performed before or after or before and after the method for surface treatment according to the present invention.

For example, the surface onto which surface treatment has been performed can be washed with pure water using a brush (for example, made of polyvinyl alcohol) at a rotation speed of 10 to 200 rpm for 10 to 120 seconds. After that, a polished object to be polished to which surface treatment has been performed can be dried by rotating the polished object to be polished at a rotation speed of 100 to 2000 rpm for 10 to 120 seconds.

(Method for Producing Semiconductor Substrate)

In the present invention, an object to be polished that is to be subjected to a CMP step contains both a silicon-silicon bond and a nitrogen-silicon bond, and is intended to serve preferably as a semiconductor substrate. Impurities remain on a surface of the polished object to be polished after a CMP step, and when a semiconductor substrate is produced by sufficiently removing defects on the surface of the polished object to be polished with the composition for surface treatment according to the present invention, the reliability of a device can be improved without adversely affecting the electric characteristics of the semiconductor.

That is, in the present invention, there is also provided a method for producing a semiconductor substrate, including treating a surface of a polished object to be polished by the above-described method for surface treatment. By treating a surface of the object to be polished that has been polished (polished object to be polished) after a CMP step by the above-described method for surface treatment, a semiconductor substrate in which impurities are significantly reduced can be produced, and as a result, the adverse effect on the electric characteristics of the semiconductor can be suppressed, and the reliability of a device can be improved.

In this regard, the present invention is a composition for surface treatment, containing a nonionic water-soluble polymer (A) having a main chain including only a carbon atom or a main chain consisting of a carbon atom and a nitrogen atom, and an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom, and the composition for surface treatment is used for surface treatment of a polished object to be polished containing a silicon-silicon bond and a nitrogen-silicon bond and the composition for surface treatment has a pH of less than 9.0 when, which is suitably used for surface treatment of a polished object to be polished containing a silicon-silicon bond and a nitrogen-silicon bond. In that sense, the composition for surface treatment according to the present invention is suitably used also for the surface treatment of a polished object to be polished containing at least one of a silicon-silicon bond and a nitrogen-silicon bond. Accordingly, in the present application, there is also provided a composition for surface treatment, containing a nonionic water-soluble polymer (A) having a main chain including only a carbon atom or a main chain consisting of a carbon atom and a nitrogen atom, and an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom, and having a pH of less than 9.0, which is used for surface treatment of a polished object to be polished containing at least one of a silicon-silicon bond and a nitrogen-silicon bond. For the detailed description of the composition for surface treatment, the above-mentioned description can be applied.

EXAMPLES

The present invention will be described in more detail by way of the following Examples and Comparative Examples. However, the technical scope of the present invention is not limited only to the following Examples. Note that in Examples, the expression of "part(s)" or "%" is used, and the "part(s)" or "%" represents "part(s) by mass" or "% by mass" unless otherwise specifically noted. Further, unless otherwise noted, each operation is performed at room temperature (25° C.)

<Preparation of Polished Object to be Polished>

As an object to be polished, a 12-inch polysilicon wafer (thickness: $20 \times 10^3$ Å) and a 12-inch silicon nitride wafer (thickness: $3 \times 10^3$ Å) were prepared, and these objects to be polished were polished under the following polishing conditions with the following polishing slurry A to obtain polished objects to be polished, respectively.

(Slurry A)

Respective raw materials were mixed in pure water at a mixing temperature of around 25° C. for a mixing time of around 10 minutes to obtain a slurry A containing 2% by mass of abrasive grains (colloidal silica having an average primary particle size of 35 nm and an average secondary particle size of 70 nm) and 0.1% by mass of PVP.

(Polishing Condition)

Polishing device: FREX 300E manufactured by Ebara Corporation

Polishing pad: Dow IC1010

Rotation speed of head: 91 rpm

Rotation speed of platen: 90 rpm

Pressure between the polished object to be polished and the pad: 2 psi

Supply amount of polishing composition: 300 ml/min

Supply of polishing composition: continuous pouring and flowing

Polishing time: 1 minute

Example 1

(Preparation of Composition for Surface Treatment)

By mixing PVA (component (A)) shown in Table 1 as a component 1, poly(methacrylic acid sodium salt) (component (B)) shown in Table 1 as a component 2 and nitric acid as a pH adjusting agent in pure water so as to become the composition shown in Table 1, a composition for surface treatment was prepared (mixing temperature: around 25° C., and mixing time: around 3 minutes). Note that the saponification degree of the "PVA" used in Examples and Comparative Examples was 95% or more.

The pH was confirmed by a pH meter (model number: LAQUA manufactured by HORIBA, Ltd.) (solution temperature: 25° C.)

As the weight average molecular weight, a value obtained with the measurement by gel permeation chromatography (GPC) using polystyrene as the reference substance was adopted.

(Surface Treatment Step)

Each of the polished objects to be polished prepared in the above was subjected to surface treatment under the following surface treatment conditions by using the composition for surface treatment prepared in the above.

(Surface Treatment Condition)

Surface treatment device: FREX 300E manufactured by Ebara Corporation

Polishing pad: Dow IC1010

Rotation speed of head: 61 rpm

Rotation speed of platen: 60 rpm

Pressure between the polished object to be polished and the pad: 1 psi

Supply amount of composition for surface treatment: 300 ml/min

Supply of composition for surface treatment: continuous pouring and flowing

Surface treatment time: 1 minute (Water-Washing Step)

The surface onto which surface treatment had been performed was washed with pure water by using a brush made of polyvinyl alcohol at a rotation speed of 100 rpm for 50 seconds. After that, a polished object to be polished to which surface treatment had been performed was dried by rotating the polished object to be polished at a rotation speed of 1500 rpm for 60 seconds.

(Evaluation of the Number of Defects)

The number of defects (having 0.23 m or more for a polysilicon wafer, and 0.16 m or more for a silicon nitride wafer) on the entire surface of a 12-inch wafer being the polished object to be polished after surface treatment had been performed and water-washing had been performed was evaluated by using SP-1 manufactured by KLA-Tencor Corporation.

Specifically, the LPD (Large Particle Distribution) value was measured by dark-field measurement (Dark-field composited oblique channel). The results are shown in Table 1.

The higher the LPD value is, the poorer the defect performance is, and if the number of defects in the polysilicon wafer is 360 pieces or less and further the number of defects in the silicon nitride wafer is 820 pieces or less, it can be determined that the polished object to be polished can be used for a semiconductor substrate as a polished object to be polished having a sufficiently low number of defects and having a silicon-silicon bond and a nitrogen-silicon bond.

In this regard, in Examples, evaluations were made by using each of the polysilicon wafer and the silicon nitride wafer, and also in a case where a polished object to be polished having both of a silicon-silicon bond and a nitrogen-silicon bond, it can be assumed that similar evaluation results are obtained.

Other Examples and Comparative Examples

In a similar manner as in Example 1, by mixing components shown in Table 1, and a pH adjusting agent depending on the case, a composition for surface treatment was prepared. After that, in a similar manner as that described above, the surface treatment and the water-washing were performed, and the evaluations were made. The results are shown in Table 1.

TABLE 1

| | pH adjusting | | | Component 1 | | | Component 2 | | | Defect count on poly-Si (>0.23 um) | Defect count on SiN (>0.16 um) |
|---|---|---|---|---|---|---|---|---|---|---|---|
| | pH | agent | Name | M.w | Concentration | Name | M.w | Concentration | | | |
| Comparative Example 1 | 3.0 | Nitric acid | PVA manufactured by ALDRICH | ~10,000 | 0.1 wt % | — | — | — | | 4194 | 2223 |
| Comparative Example 2 | 3.0 | Nitric acid | — | — | — | Poly(methacrylic acid sodium salt) manufactured by ALDRICH | 4,000-6,000 | 0.1 wt % | | over flow | 645 |
| Example 1 | 3.0 | Nitric acid | PVA manufactured by ALDRICH | ~10,000 | 0.1 wt % | Poly(methacrylic acid sodium salt) manufactured by ALDRICH | 4,000-6,000 | 0.1 wt % | | 75 | 383 |
| Comparative Example 3 | 9.0 | Ammonium solution + ammonium acetate | | | | Poly(2-acrylamide-2-methyl-1-propanesulfonic acid) manufactured by ACROS | 800,000 | 0.1 wt % | | 93 | 1032 |
| Comparative Example 4 | | | | | | Poly(butadiene/maleic acid) manufactured by PolyScience | 12,500 | 0.1 wt % | | 116 | 938 |
| Comparative Example 5 | | | | | | Poly(methacrylic acid sodium salt) manufactured by ALDRICH | 4,000-6,000 | 0.1 wt % | | 244 | 1649 |
| Example 2 | 3.0 | Nitric acid | PVA manufactured by ALDRICH | ~10,000 | 0.1 wt % | Polystyrene sulfonic acid ammonium salt manufactured by ALDRICH | 200,000 | 0.1 wt % | | 90 | 686 |
| Example 3 | | | | | | Poly(2-acrylamide-2-methyl-1-propanesulfonic acid) manufactured by ACROS | 800,000 | 0.1 wt % | | 87 | 677 |
| Example 4 | | | | | | Polystyrene sulfonic acid manufactured by Alfa Aesar | 75,000 | 0.1 wt % | | 112 | 724 |
| Example 5 | | | | | | Poly(acrylic acid-co-maleic acid) manufactured by ALDRICH | 3,000 | 0.1 wt % | | 73 | 470 |
| Example 6 | | | | | | Poly(methacrylic acid sodium salt) manufactured by ALDRICH | 4,000-6,000 | 0.1 wt % | | 75 | 383 |
| Example 7 | | | | | | Poly(acrylic acid-co-maleic acid anhydride) manufactured by Seedchem Company PTY. LTD | 50,000 | 0.1 wt % | | 188 | 230 |
| Example 8 | | | | | | Acrylic acid-2-hydroxypropyl acrylate copolymer manufactured by Seedchem Company PTY. LTD | 12,500 | 0.1 wt % | | 278 | 402 |
| Example 9 | 3.0 | Nitric acid | PVA manufactured by ALDRICH | ~10,000 | 0.1 wt % | Polymaleic acid manufactured by Seedchem Company PTY. LTD | 10,000 | 0.1 wt % | | 98 | 522 |
| Example 10 | | | | | | Polyacrylic acid manufactured by TOAGOSEI CO., LTD. | 1,000-2,000 | 0.1 wt % | | 133 | 304 |
| Example 11 | | | | | | Polyacrylic acid manufactured by TOAGOSEI CO., LTD. | 50,000 | 0.1 wt % | | 94 | 356 |

TABLE 1-continued

| | pH | pH agent | Component 1 Name | Component 1 M.w | Component 1 Concentration | Component 2 Name | Component 2 M.w | Component 2 Concentration | Defect count on poly-Si (>0.23 um) | Defect count on SiN (>0.16 um) |
|---|---|---|---|---|---|---|---|---|---|---|
| Example 12 | | | | | | Acrylic acid-2-acrylamide-2-methylpropane sulfonic acid copolymer manufactured by Seedchem Company PTY. LTD | 50,000 | 0.1 wt % | 86 | 561 |
| Example 13 | 5.0 | Histidine | | | | Poly(methacrylic acid sodium salt) manufactured by ALDRICH | 4,000-6,000 | 0.1 wt % | 80 | 605 |
| Example 14 | 7.0 | none | | | | Poly(methacrylic acid sodium salt) manufactured by ALDRICH | 4,000-6,000 | 0.1 wt % | 83 | 811 |
| Example 15 | 3.0 | Nitric acid | PVA manufactured by ALDRICH | ~10,000 | 0.1 wt % | Poly(methacrylic acid sodium salt) manufactured by ALDRICH | 4,000-6,000 | 0.1 wt % | 75 | 383 |
| Comparative Example 6 | 3.0 | Nitric acid | Carboxymethyl-cellulose manufactured by ALDRICH | 90,000 | 0.1 wt % | Poly(methacrylic acid sodium salt) manufactured by ALDRICH | 4,000-6,000 | 0.1 wt % | over flow | 657 |
| Comparative Example 7 | | | Carboxymethyl-cellulose ammonium salt manufactured by ALDRICH | NA | 0.1 wt % | | | | over flow | 475 |
| Comparative Example 8 | | | Gum arabic manufactured by ALDRICH | 250,000 | 0.1 wt % | | | | over flow | 433 |
| Comparative Example 9 | | | Polyglycerin manufactured by AK Scientific Inc. | 759 | 0.1 wt % | | | | over flow | 719 |
| Example 16 | | | PVP manufactured by ALDRICH | 40,000 | 0.1 wt % | | | | 156 | 488 |
| Example 17 | | | Aquazol 50 manufactured by Polymer Chemistry Innovations Inc. | 50,000 | 0.1 wt % | | | | 356 | 784 |
| Comparative Example 10 | | | PVA manufactured by ALDRICH | ~10,000 | 0.1 wt % | | | | 10850 | 3562 |
| Comparative Example 11 | 3.0 | Nitric acid | PVA manufactured by ALDRICH | ~10,000 | 0.1 wt % | PEG-PPG-PEG, Pluronic L-31 manufactured by ALDRICH | 1,100 | 0.1 wt % | 316 | 1638 |
| Comparative Example 12 | | | PVA manufactured by ALDRICH | ~10,000 | 0.1 wt % | Polypropylene glycol 400 manufactured by ALDRICH Hydroxyethyl cellulose manufactured by ALDRICH | 400 / 90,000 | 0.1 wt % | 621 | 1742 |

(Consideration)

If the composition for surface treatment according to the present invention is used, since the number of defects in a polysilicon wafer is 360 pieces or less and further the number of defects in a silicon nitride wafer is 820 pieces or less, it is suggested that defects on a surface of a polished object to be polished having both of a silicon-silicon bond and a nitrogen-silicon bond are sufficiently removed. On the other hand, when compositions of Comparative Examples are used, the number of defects in a polysilicon wafer may exceed 360 pieces, or the number of defects in a silicon nitride wafer may exceed 820 pieces, and it is suggested that defects on a surface of a polished object to be polished having both of a silicon-silicon bond and a nitrogen-silicon bond cannot be sufficiently removed.

Note that this application is based on Japanese Patent Application No. 2016-184768, filed with the Japan Patent Office on Sep. 21, 2016, the entire content of which is hereby incorporated by reference.

The invention claimed is:

1. A composition for surface treatment, comprising
a nonionic water-soluble polymer (A) having a main chain including only a carbon atom or a main chain consisting of a carbon atom and a nitrogen atom, and
an anionic water-soluble polymer (B) having a main chain including only a carbon atom and a side chain having a sulfonic acid group or a group having a salt thereof or a carboxyl group or a group having a salt thereof, and being bonded to the main chain including only a carbon atom,
wherein the composition is used for surface treatment of an object to be polished containing a silicon-silicon bond and a nitrogen-silicon bond,
the composition for surface treatment does not contain abrasive grains, comprises a dispersing medium consisting of water, and a pH of the composition is less than 9.0, and
wherein water is the only solvent present in the composition.

2. The composition for surface treatment according to claim 1, wherein
the nonionic water-soluble polymer (A) contains a constituent unit represented by the following formula (1):

[Chemical formula 1]

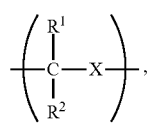

(1)

wherein X is represented by the following formula:

[Chemical formula 2]

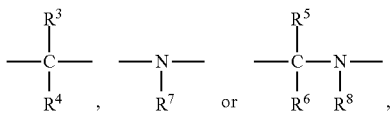

$R^1$ to $R^6$ are each independently a hydrogen atom or -J,
J is represented by a hydroxyl group,

[Chemical formula 3]

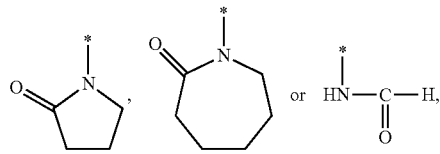

provided that the symbol * represents a bonding position,
$R^7$ and $R^8$ are each independently a hydrogen atom or -E,
E is represented by the following formula:

[Chemical formula 4]

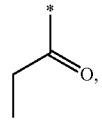

provided that the symbol * represents a bonding position, and
the constituent unit contains at least one of -J and -E.

3. The composition for surface treatment according to claim 1, wherein
the nonionic water-soluble polymer (A) is at least one kind selected from the group consisting of polyvinyl alcohol (PVA), a copolymer containing a constituent unit derived from polyvinyl alcohol (PVA) as a part of a structure, polyvinylpyrrolidone (PVP), a copolymer containing a constituent unit derived from polyvinylpyrrolidone (PVP) as a part of a structure, polyvinyl caprolactam, a copolymer containing a constituent unit derived from polyvinyl caprolactam as a part of a structure, polyN-vinylformamide, and a copolymer containing a constituent unit derived from polyN-vinylformamide as a part of a structure.

4. The composition for surface treatment according to claim 1, wherein
the nonionic water-soluble polymer (A) is polyvinyl alcohol (PVA) or a copolymer containing a constituent unit derived from polyvinyl alcohol (PVA) as a part of a structure.

5. The composition for surface treatment according to claim 4, wherein
the polyvinyl alcohol (PVA) or the copolymer containing a constituent unit derived from polyvinyl alcohol (PVA) as a part of a structure has a saponification degree of 60% or more.

6. The composition for surface treatment according to claim 1, wherein the anionic water-soluble polymer (B) contains a constituent unit represented by the following formula (2):

[Chemical formula 5]

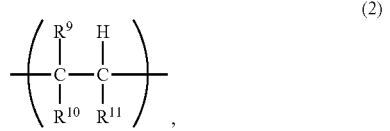
(2)

wherein $R^9$ is a hydrogen atom or a methyl group,
$R^{10}$ and $R^{11}$ are each independently a hydrogen atom, —$COOR^{12}$, or -G, provided that $R^{10}$ and $R^{11}$ are not hydrogen atoms at the same time,
G is represented by the following formula:

[Chemical formula 6]

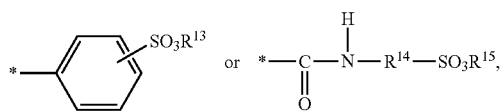

provided that the symbol * represents a bonding position,
$R^{12}$, $R^{13}$ and $R^{15}$ are each independently a hydrogen atom, an alkyl group having 1 to 12 carbon atoms, a hydroxyalkyl group having 1 to 12 carbon atoms, or a counter cation, and
$R^{14}$ is a divalent group.

7. The composition for surface treatment according to claim 6, wherein
at least one of $R^{10}$ and $R^{11}$ in the anionic water-soluble polymer (B) is -G,
G is represented by the following formula:

[Chemical formula 7]

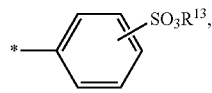

wherein $R^{13}$ is a hydrogen atom, an alkyl group having 1 to 12 carbon atoms, a hydroxyalkyl group having 1 to 12 carbon atoms, or a counter cation, provided that the symbol * represents a bonding position, and
the anionic water-soluble polymer (B) has a weight average molecular weight of 100,000 or more.

8. The composition for surface treatment according to claim 1, wherein
the composition for surface treatment has a pH of less than 7.0.

9. A method for surface treatment for an object to be polished, comprising
performing surface treatment of an object to be polished by contacting the object with the composition for surface treatment according to claim 1.

10. A method for producing a semiconductor substrate, comprising
treating a surface of an object to be polished by the method for surface treatment according to claim 9.

* * * * *

UNITED STATES PATENT AND TRADEMARK OFFICE
CERTIFICATE OF CORRECTION

PATENT NO. : 11,326,049 B2  
APPLICATION NO. : 16/330034  
DATED : May 10, 2022  
INVENTOR(S) : Jingzhi Chen Page 1 of 1

It is certified that error appears in the above-identified patent and that said Letters Patent is hereby corrected as shown below:

In the Claims

Column 21, Line 60-65, Claim 2, Chemical formula 1 should be replaced with:

"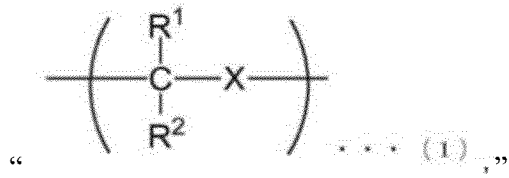,"

Column 22, Line 12, Claim 2, "J is represented by a hydroxyl group," should be replaced with:
"-J is represented by a hydroxyl group,"

Column 22, Line 26, Claim 2, "E is represented by the following formula:" should be replaced with:
"-E is represented by the following formula:"

Column 23, Line 5-10, Claim 6, Chemical formula 5 should be replaced with:

"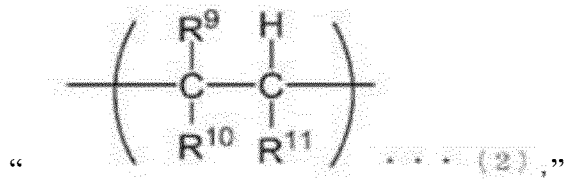,"

Column 23, Line 17, Claim 6, "G is represented by the following formula:" should be replaced with:
"-G is represented by the following formula:"

Column 24, Line 5, Claim 7, "G is represented by the following formula:" should be replaced with:
"-G is represented by the following formula:"

Signed and Sealed this  
Twenty-seventh Day of December, 2022

Katherine Kelly Vidal  
*Director of the United States Patent and Trademark Office*